(12) United States Patent
Mei (10) Patent No.: US 11,335,875 B2
(45) Date of Patent: May 17, 2022

(54) QUANTUM DOT DISPLAY SUBSTRATE, METHOD FOR MANUFACTURING THE SAME AND DISPLAY DEVICE

(71) Applicant: BOE Technology Group Co., Ltd., Beijing (CN)

(72) Inventor: Wenhai Mei, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 27 days.

(21) Appl. No.: 16/908,008

(22) Filed: Jun. 22, 2020

(65) Prior Publication Data

US 2020/0411783 A1 Dec. 31, 2020

(30) Foreign Application Priority Data

Jun. 27, 2019 (CN) .......................... 201910567183.8

(51) Int. Cl.
*H01L 51/50* (2006.01)
*H01L 51/56* (2006.01)

(52) U.S. Cl.
CPC ........ *H01L 51/502* (2013.01); *H01L 51/5048* (2013.01); *H01L 51/56* (2013.01); *H01L 2251/303* (2013.01)

(58) Field of Classification Search
CPC ... H01L 51/502; H01L 51/5048; H01L 51/56; H01L 2251/303; H01L 27/3241
(Continued)

(56) References Cited

U.S. PATENT DOCUMENTS

2010/0051901 A1* 3/2010 Kazlas ................. C09K 11/565
257/13
2010/0283036 A1* 11/2010 Coe-Sullivan ...... H01L 51/5088
257/13
(Continued)

FOREIGN PATENT DOCUMENTS

CN 101207150 A 6/2008
CN 105259694 A 1/2016
(Continued)

OTHER PUBLICATIONS

First Office Action dated Mar. 3, 2021 corresponding to Chinese application No. 201910567183.8.
(Continued)

*Primary Examiner* — Sheikh Maruf
(74) *Attorney, Agent, or Firm* — Nath, Goldberg & Meyer; Joshua B. Goldberg (57) ABSTRACT

A quantum dot display substrate, a method for manufacturing a quantum dot display substrate and a display device are provided. The method includes: forming a carrier transport layer on a substrate; forming a quantum dot layer emitting light of a corresponding color in each of the pixel regions, and forming the quantum dot layer includes: forming a pattern-defining layer on the carrier transport layer, the pattern-defining layer exposes a portion of the carrier transport layer in the pixel region and covers remaining portion of the carrier transport layer, hydrophilicity and hydrophobicity of the pattern-defining layer are respectively opposite to those of the exposed portion of the carrier transport layer; coating a quantum dot solution, hydrophilicity and the hydrophobicity of the quantum dot solution are respectively the same as those of the exposed portion of the carrier transport layer; and curing the quantum dot solution.

15 Claims, 4 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2011/0140075 A1* | 6/2011 | Zhou | ..................... | H01L 51/502 |
| | | | | 257/13 |
| 2012/0292594 A1* | 11/2012 | Zhou | ..................... | B82Y 30/00 |
| | | | | 257/13 |
| 2013/0009131 A1* | 1/2013 | Kazlas | ................ | H01L 51/5004 |
| | | | | 257/13 |
| 2014/0027712 A1* | 1/2014 | Breen | ................ | H01L 51/5072 |
| | | | | 257/13 |
| 2014/0234999 A1* | 8/2014 | Kim | ....................... | H05B 33/14 |
| | | | | 438/26 |
| 2015/0228850 A1* | 8/2015 | Zheng | ................... | H05B 33/14 |
| | | | | 257/13 |
| 2016/0079316 A1* | 3/2016 | Zhou | ....................... | H01L 33/06 |
| | | | | 257/13 |
| 2018/0158984 A1* | 6/2018 | Manders | ............. | H01L 33/0029 |
| 2019/0320517 A1* | 10/2019 | Nakanishi | ............... | H01L 27/32 |
| 2019/0326539 A1* | 10/2019 | Chung | ................ | H01L 51/5028 |
| 2019/0386233 A1* | 12/2019 | Wu | ........................ | H01L 33/28 |
| | | | | 257/13 |

FOREIGN PATENT DOCUMENTS

| | | |
|---|---|---|
| CN | 105505742 A | 4/2016 |
| CN | 106025083 A | 10/2016 |
| CN | 106252528 A | 12/2016 |
| CN | 107359254 A | 11/2017 |
| CN | 108133952 A | 6/2018 |
| WO | 2018036542 A1 | 3/2018 |

OTHER PUBLICATIONS

Office Action dated Nov. 19, 2021 issued in corresponding Chinese Application No. 201910567183.8.

* cited by examiner

QUANTUM DOT DISPLAY SUBSTRATE, METHOD FOR MANUFACTURING THE SAME AND DISPLAY DEVICE

CROSS-REFERENCE TO RELATED APPLICATIONS

The present application claims the priority of Chinese Patent Application No. 201910567183.8, filed on Jun. 27, 2019, the contents of which are incorporated herein in their entirety by reference.

TECHNICAL FIELD

The present disclosure relates to the technical field of display, and in particular to a quantum dot display substrate, a method for manufacturing a quantum dot display substrate and a display device.

BACKGROUND

With development of quantum dot technology, researches related to a quantum dot light emitting diode (QLED) are increasingly deep, a quantum efficiency of the quantum dot light emitting diode is continuously improved and substantially reaches a level of industrialization, so that a realization of industrialization of the quantum dot light emitting diode becomes a future trend.

SUMMARY

An embodiment of the present disclosure provides a method for manufacturing a quantum dot display substrate, where the quantum dot display substrate includes a plurality of pixel regions arranged at intervals, and the pixel regions are configured to emit light of at least one color, and the method includes:

forming a carrier transport layer on a substrate;

forming a quantum dot layer emitting light of a corresponding color in each of the pixel regions, wherein forming the quantum dot layer includes:

forming a pattern-defining layer on the carrier transport layer, the pattern-defining layer exposes a portion of the carrier transport layer in the pixel region where the quantum dot layer is to be formed and covers remaining portion of the carrier transport layer; and hydrophilicity and hydrophobicity of the pattern-defining layer are opposite to those of the exposed portion of the carrier transport layer;

coating quantum dot solution having the same hydrophilicity and hydrophobicity as those of the exposed portion of the carrier transport layer, so that the quantum dot solution is attached to a surface of the exposed portion of the carrier transport layer;

curing the quantum dot solution to form the quantum dot layer.

In some implementations, the carrier transport layer includes a plurality of nanostructures arranged in an array and uniformly oriented.

In some implementations, the nanostructures are nanorods.

In some implementations, the carrier transport layer is a hydrophilic electron transport layer, a material of the nanostructures includes at least one of zinc oxide, magnesium zinc oxide, or titanium oxide, and the method further includes:

before coating the quantum dot solution, illuminating the portion of the carrier transport layer in the pixel region where the quantum dot layer is to be formed, so as to improve an oxygen vacancy content in the nanostructures.

In some implementations, the pattern-defining layer is made of a photodegradable material;

forming the pattern-defining layer on the carrier transport layer includes:

forming a pattern-defining material layer;

exposing and degrading a portion of the pattern-defining material layer in the pixel region where the quantum dot layer is to be formed, so as to obtain the pattern-defining layer.

In some implementations, forming the pattern-defining material layer includes:

placing and soaking the substrate formed with the carrier transport layer in a photodegradable hydrophobic system solution for a predetermined period of time, and removing the hydrophobic system solution outside a region where the carrier transport layer is located;

curing the hydrophobic system solution on the carrier transport layer to obtain the pattern-defining material layer.

In some implementations, the hydrophobic system solution includes: a polymer resin, a hydrophobic solvent, a hydrophobic agent, and a photosensitizer.

In some implementations, the hydrophobic solvent includes a fluoroacrylate emulsion.

In some implementations, the polymer resin includes a polyketone resin or a polylactate resin; the fluoroacrylate emulsion includes hexafluorobutyl methacrylate; the hydrophobic agent includes perfluorooctylvinyldimethoxysilane; the photosensitizer includes n-isobutyl benzoin.

In some implementations, the quantum dot solution includes a hydrophilic ligand.

An embodiment of the present disclosure further provides a quantum dot display substrate, which is divided into a plurality of pixel regions and a spacer region located between adjacent ones of the pixel regions, where the pixel regions are configured to emit light of at least one color, and the quantum dot display substrate includes a substrate and a carrier transport layer disposed on the substrate;

a quantum dot layer in each of the pixel regions and a pattern-defining layer in the spacer region are arranged on the carrier transport layer, and the quantum dot layer in each of the pixel regions is configured to emit light of a corresponding color;

hydrophilicity and hydrophobicity of a portion of the carrier transport layer located in each of the pixel regions are respectively the same as those of the quantum dot layer, and are opposite to those of the pattern-defining layer.

In some implementations, the pattern-defining layer is made of a photodegradable material.

In some implementations, the carrier transport layer includes a plurality of nanostructures arranged in an array and uniformly oriented.

In some implementations, the carrier transport layer is an electron transport layer, and a material of the nanostructures includes at least one of zinc oxide, magnesium zinc oxide, or titanium oxide.

An embodiment of the present disclosure further provides a display device, which includes the quantum dot display substrate described as above.

DESCRIPTION OF DRAWINGS

The accompanying drawings are included to provide a further understanding of embodiments of the present disclosure, are incorporated in and constitute a part of the specification, and illustrate the solutions of the present disclosure together with the following detailed description of the embodiments, but do not constitute a limitation to the present disclosure. In the drawings.

DESCRIPTION OF EMBODIMENTS

The following detailed description of embodiments of the present disclosure are given by referring to the accompanying drawings. It should be understood that the described embodiments are only used for illustrating and explaining technical solutions of the present disclosure, and are not intended to limit the technical solutions of the present disclosure.

An embodiment of the present disclosure provides a method for manufacturing a quantum dot display substrate, which includes a plurality of pixel regions arranged at intervals, the pixel regions are configured to emit light of at least one color. For example, the pixel regions may include a red pixel region, a green pixel region, and a blue pixel region.

Figure 1:
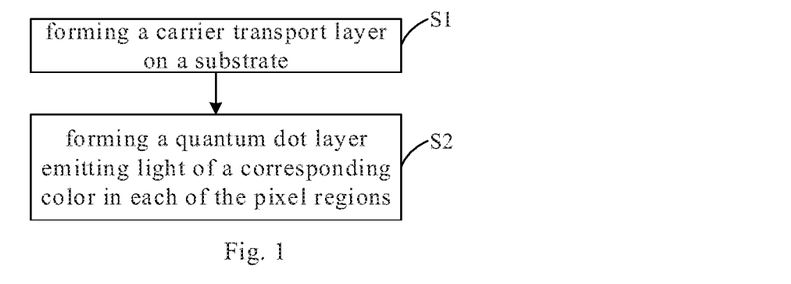
FIG. 1 is a flowchart of a method for manufacturing a quantum dot display substrate according to an embodiment of the present disclosure.

FIG. 1 is a flowchart of a method for manufacturing a quantum dot display substrate according to an embodiment of the present disclosure, and as shown in FIG. 1, the method includes following steps S1 and S2.

At step S1, forming a carrier transport layer on a substrate.

The carrier transport layer is a hole transport layer or an electron transport layer adjacent to a quantum dot layer in a quantum dot light-emitting structure.

At step S2, forming a quantum dot layer emitting light of a corresponding color in each of the pixel regions.

Figure 2:
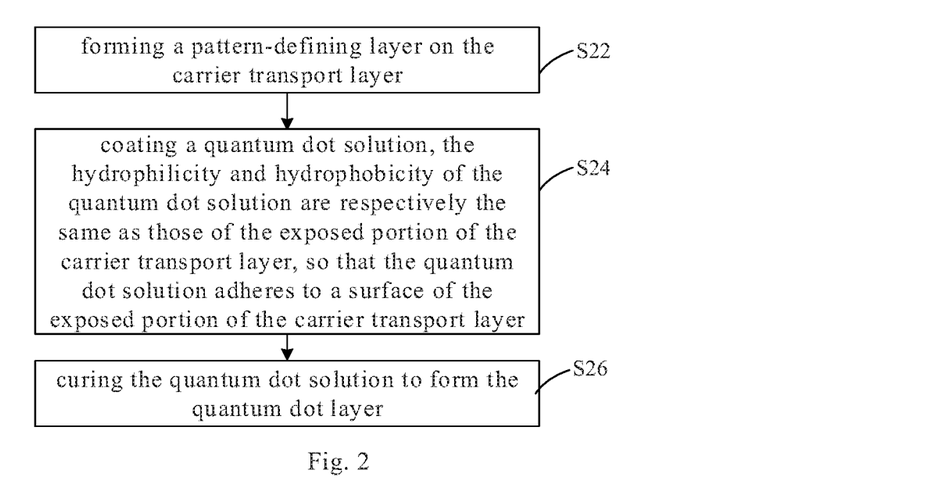
FIG. 2 is a flowchart of steps for forming a quantum dot layer in each pixel region in an embodiment of the present disclosure.

FIG. 2 is a flowchart of steps for forming a quantum dot layer in each of the pixel regions in an embodiment of the present disclosure, and as shown in FIG. 2, forming the quantum dot layer in each of the pixel regions includes steps S22, S24 and S26.

At step S22, forming a pattern-defining layer on the carrier transport layer. The pattern-defining layer exposes a portion of the carrier transport layer in the pixel region where the quantum dot layer is to be formed and covers remaining portion of the carrier transport layer; and hydrophilicity and hydrophobicity of the pattern-defining layer are respectively opposite to those of the exposed portion of the carrier transport layer. That is, one of the pattern-defining layer and the exposed portion of the carrier transport layer is hydrophilic, and the other is hydrophobic.

It should be understood that "the exposed portion of the carrier transport layer" in the present disclosure refers to the portion of the carrier transport layer that is exposed by the pattern-defining layer, that is, the portion of the carrier transport layer that is located in the pixel region where the quantum dot layer is to be formed.

At step S24, coating a quantum dot solution, the hydrophilicity and hydrophobicity of the quantum dot solution are respectively the same as those of the exposed portion of the carrier transport layer, so that the quantum dot solution adheres to a surface of the exposed portion of the carrier transport layer. When the quantum dot layer is formed in each of the pixel regions, the quantum dot solution coated in step S24 is a solution corresponding to the quantum dot layer emitting light of the corresponding color, for example, when the quantum dot layer is formed in the red pixel region, the quantum dot solution coated in step S24 is a solution capable of forming a red quantum dot layer after being cured.

At step S26, curing the quantum dot solution to form the quantum dot layer.

In the present disclosure, hydrophilicity and hydrophobicity of the quantum dot solution are respectively the same as those of the exposed portion of the carrier transport layer and are opposite to those of the pattern-defining layer, and thus, a relative strong adhesion force is formed between the quantum dot solution and the exposed portion of the carrier transport layer and a relative weak adhesion force is formed between the quantum dot solution and the pattern-defining layer, so that the quantum dot solution is attached to the exposed portion of the carrier transport layer, that is, in the pixel region where the quantum dot layer is to be formed, thereby achieving patterning of the quantum dot layer.

The following describes a method for manufacturing the quantum dot display substrate in detail. The method includes following steps S1 and S2.

Figure 3:
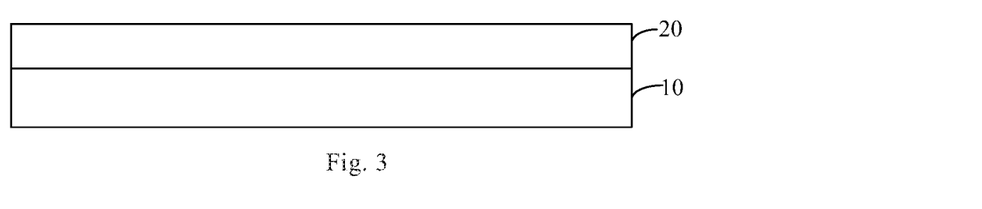
FIG. 3 is a schematic structural diagram of a structure in which a carrier transport layer has been formed on a substrate according to an embodiment of the present disclosure.

At step S1, forming a carrier transport layer 20 on a substrate 10, as shown in FIG. 3.

In some implementations, the carrier transport layer 20 is a hydrophilic electron transport layer.

Figure 4:
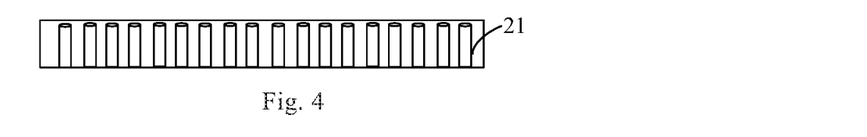
FIG. 4 is a schematic diagram of an array structure of nanorods in a carrier transport layer.

In some implementations, as shown in FIG. 4, the carrier transport layer 20 includes a plurality of nanostructures 21 arranged in an array and uniformly oriented.

The nanostructures 21 may be nanorods perpendicular to the substrate, so as to increase a specific surface area of the carrier transport layer 20, and facilitate the quantum dot solution to be attached to the carrier transport layer 20 in subsequent steps.

A material of the nanostructures 21 may include at least one of zinc oxide, magnesium zinc oxide, or titanium oxide.

An array of nanorods may be manufactured by a hydrothermal method. Taking a material of the nanorods being zinc oxide as an example, the process for manufacturing the array of nanorods includes following steps: spin-coating a layer of compact zinc oxide nano particle film on the substrate 10, placing the substrate 10 formed with the zinc oxide nano particle film thereon in a mixed solution of zinc nitrate (i.e., $Zn(NO_3)_2$) and hexamethylenetetramine (i.e., $(CH_2)_6N_4$), taking the substrate 10 out of the solution after 2 hours of hydrothermal reaction at 95° C., to obtain an uniform array of zinc oxide nanorods vertical to the substrate 10.

At step S2, forming a quantum dot layer emitting light of a corresponding color in each of the pixel regions (e.g., P1, P2 and P3).

Figure 5A:
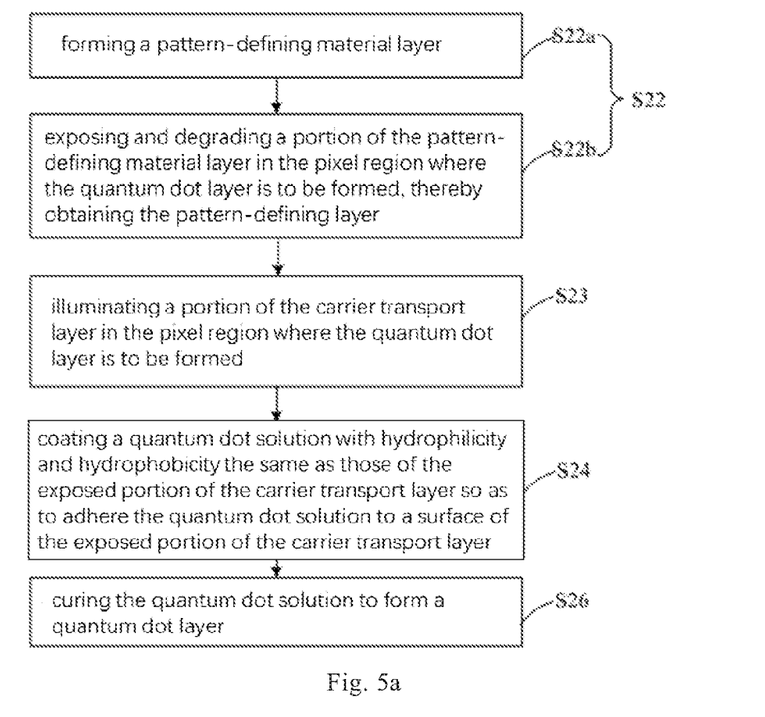
FIG. 5*a* is a flowchart of formation of a quantum dot layer in a pixel region P1 of one color.
Figure 5B:
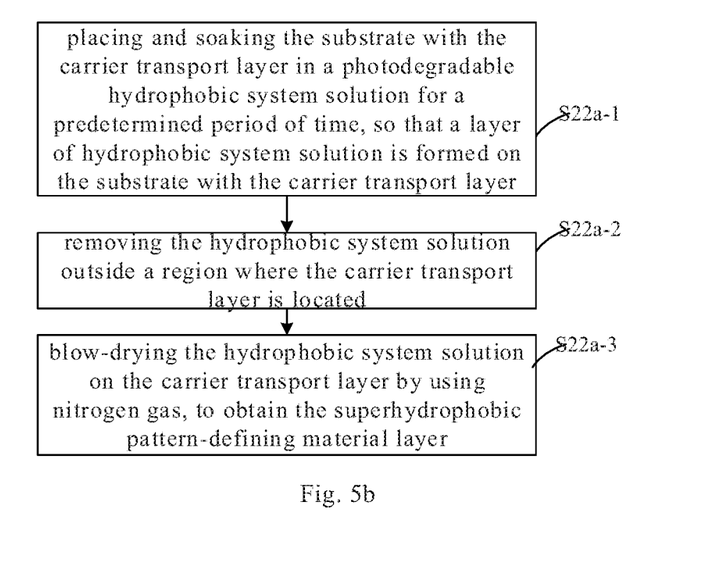
FIG. 5*b* is a flowchart of formation of a pattern-defining material layer.

FIG. 5*a* is a flowchart of formation of a quantum dot layer in the pixel region P1 of one color; FIG. 5*b* is a flowchart of formation of a pattern-defining material layer; FIGS. 6*a* to 6d are schematic diagrams illustrating a process of forming a quantum dot layer in the pixel region P1 of one color. As shown in FIGS. 5a to 6d, forming the quantum dot layer in the pixel region P1 includes steps S22, S24, and S26.

In some implementations, after step S22, step S23 may further be included.

At step S22, forming a pattern-defining layer 30 on the carrier transport layer 20. The pattern-defining layer 30 exposes a portion of the carrier transport layer 20 in the pixel region P1 where the quantum dot layer is to be formed, and covers remaining portion of the carrier transport layer 20; and the hydrophilicity and hydrophobicity of the pattern-defining layer 30 are respectively opposite to those of the exposed portion of the carrier transport layer 20.

In some implementations, the pattern-defining layer 30 is made of a photodegradable material, and at this time, step S22 may specifically include steps S22a and S22b.

Figure 6A:
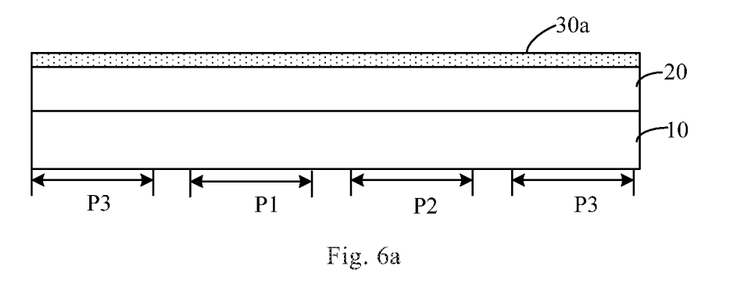
FIGS. 6*a* to 6*d* are schematic diagrams illustrating a process of forming a quantum dot layer in the pixel region P1 of one color.

At step S22a, forming a pattern-defining material layer 30a, as shown in FIG. 6a, a thickness of the pattern-defining material layer 30a may range from 10 nm to 2 μm. This step S22a may specifically include sub-steps S22a-1, S22a-2 and S22a-3, as shown in FIG. 5b.

At sub-step S22a-1, placing and soaking the substrate 10 formed with the carrier transport layer 20 in a photodegradable hydrophobic system solution for a predetermined period of time, so that a layer of hydrophobic system solution is formed on the substrate 10 formed with the carrier transport layer 20.

The hydrophobic system solution may include: a polymer resin, a hydrophobic solvent, a hydrophobic agent, and a photosensitizer. Specifically, the hydrophobic solvent may include a fluoroacrylate emulsion, the polymeric resin may include, but is not limited to, polyketone resin or polylactone resin, the fluoroacrylate emulsion may include, but is not limited to, hexafluorobutyl methacrylate, the hydrophobic agent may include, but is not limited to, perfluorooctylvinyldimethoxysilane, and the photosensitizer may include, but is not limited to, benzoin-isobutyl ester.

At sub-step S22a-2, removing the hydrophobic system solution outside a region where the carrier transport layer 20 is located.

At sub-step S22a-3, blow-drying the hydrophobic system solution on the carrier transport layer 20 by using nitrogen gas, to obtain the superhydrophobic pattern-defining material layer 30a. Certainly, other means may be used for curing the hydrophobic system solution to form a film.

It should be noted that the specific process of step S22a provided in this embodiment is only an exemplary process, and in an actual manufacturing process, the hydrophobic system solution may also be spin-coated on the carrier transport layer 20 by using a spin coating method, and the hydrophobic system solution is cured to obtain the pattern-defining material layer 30a.

Figure 6B:
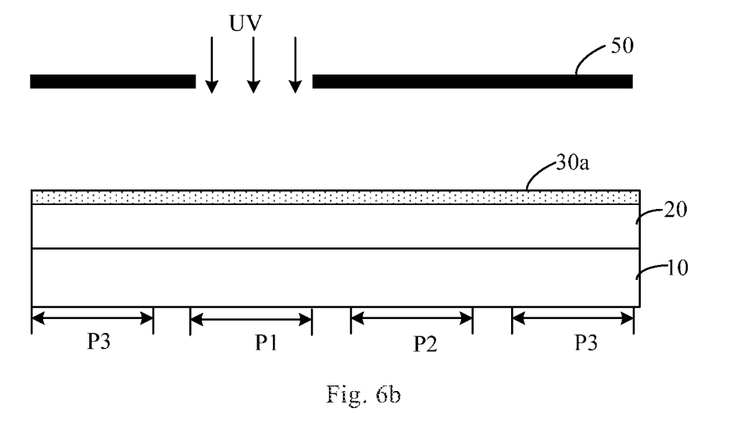
Figure 6C:
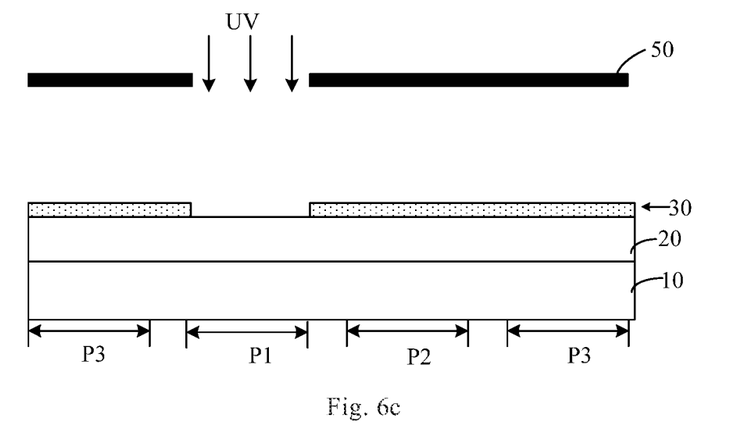

At step S22b, as shown in FIG. 6b, exposing and degrading a portion of the pattern-defining material layer 30a in the pixel region P1 where the quantum dot layer is to be formed, thereby obtaining the pattern-defining layer 30 (as shown in FIG. 6c).

During exposing, a light transmission region of a mask plate 50 is positioned above the pixel region P1 where the quantum dot layer is to be formed, so that the pixel region P1 is illuminated by light; and a light-shielding region of the mask plate 50 is located above other regions to shield them. A light source used for exposing may specifically be an ultraviolet (UV) light source.

At step S23, illuminating light to the portion of the carrier transport layer 20 in the pixel region P1 where the quantum dot layer is to be formed, so as to increase an oxygen vacancy content in the material of the nanostructures, thereby improving the hydrophilicity of the carrier transport layer 20, and further facilitating the quantum dot solution to attach to the carrier transport layer 20 in the pixel region P1.

A light source used for illuminating in step S23 may be the same light source as the light source used in step S22, and thus illuminating is performed for a certain period of time by using the same light source, so that a portion of the pattern-defining material layer 30a is degraded, and the hydrophilicity of the portion of the carrier transport layer 20 in the pixel region P is improved.

A volume fraction of oxygen vacancies may be increased to 30% to 60% by controlling a time, intensity and other parameters for illuminating, so as to prevent the oxygen vacancy content from being too high to affect a performance of a quantum dot light-emitting device while improving the hydrophilicity of the carrier transport layer 20.

At step S24, coating a quantum dot solution, hydrophilicity and hydrophobicity of the quantum dot solution are respectively the same as those of the exposed portion of the carrier transport layer 20, so that the quantum dot solution adheres to a surface of the exposed portion of the carrier transport layer 20. As described above, the exposed portion of the carrier transport layer 20 has hydrophilicity, and in such case, the quantum dot solution also has hydrophilicity.

Specifically, the quantum dot solution includes a hydrophilic ligand containing a strong hydrophilic group such as a hydroxyl group, a carboxyl group, a sulfonic group, and a phosphoric group.

Figure 6D:
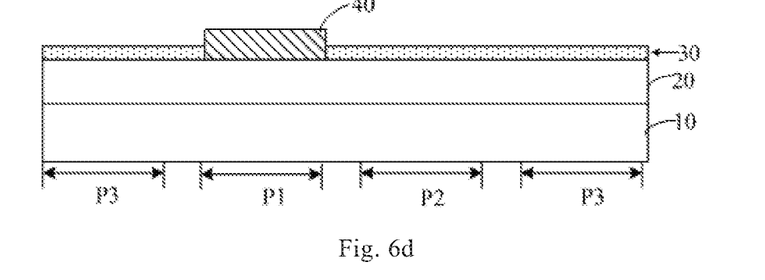

At step S26, curing the quantum dot solution to form a quantum dot layer 40, as shown in FIG. 6d.

The quantum dot solution may be cured by annealing.

After the quantum dot layer 40 is formed in the pixel region P, quantum dot layers are formed in the pixel region P2 and the pixel region P3, respectively, by using the same process as that for forming the quantum dot layer 40 in the pixel region P1.

In addition, before forming the carrier transport layer 20, a step of forming an electrode layer may be further included. In the case where the carrier transport layer 20 is an electron transport layer, the electrode layer formed before forming the electron transport layer is a cathode layer, and may be made of indium tin oxide (ITO).

A specific example of the method for manufacturing the quantum dot display substrate is described below, and in this example, the method for manufacturing the quantum dot display substrate includes following first to fifth steps.

At the first step, spin-coating a layer of compact zinc oxide nano particle film on a substrate, placing the substrate formed with the zinc oxide nano particle film in a mixed solution of zinc nitrate and hexamethylenetetramine (the zinc nitrate and the hexamethylenetetramine are raw materials for preparing the zinc oxide, and the hexamethylenetetramine is a catalyst for promoting decomposition of nitrate), and after 2 hours of hydrothermal reaction at 95° C., taking the substrate out of the solution to obtain an uniform array of zinc oxide nanorods vertical to the substrate.

At the second step, placing and soaking the substrate formed with the array of zinc oxide nanorods in a photodegradable hydrophobic system solution for 2 hours to form a layer of hydrophobic system solution on the substrate formed with the array of zinc oxide nanorods, taking the substrate out, removing the hydrophobic system solution outside a region where the array of zinc oxide nanorods is located, and drying the hydrophobic system solution on the substrate by using nitrogen to obtain a superhydrophobic pattern-defining material layer.

The photodegradable hydrophobe solution may include polyphenyl diketone resin, fluoroacrylate emulsion, perfluorooctyl vinyl dimethoxysilane and benzoin.

At the third step, irradiating the pattern-defining material layer in a green pixel region for 30 minutes by using an ultraviolet lamp emitting light with a wavelength of 365 nm, so that the pattern-defining material layer in the green pixel region is degraded, and an oxygen vacancy content of an electron transport layer in the green pixel region is increased.

At the fourth step, coating a quantum dot solution including green quantum dots and a hydrophilic ligand, so that the quantum dot solution is attached to the green pixel region due to a difference in adhesion force between the quantum dot solution and the pattern-defining layer and between the quantum dot solution and the electron transport layer. The quantum dots may be CdSe/ZnS quantum dots, and the ligand may be mercaptopropionic acid.

At the fifth step, annealing the quantum dot solution at 85° C. to obtain the quantum dot layer.

The preparation of the green quantum dot layer is completed through the second to fifth steps, and then corresponding quantum dot layers are prepared in the red pixel region and the blue pixel region, respectively, in a similar manner.

Figure 7:
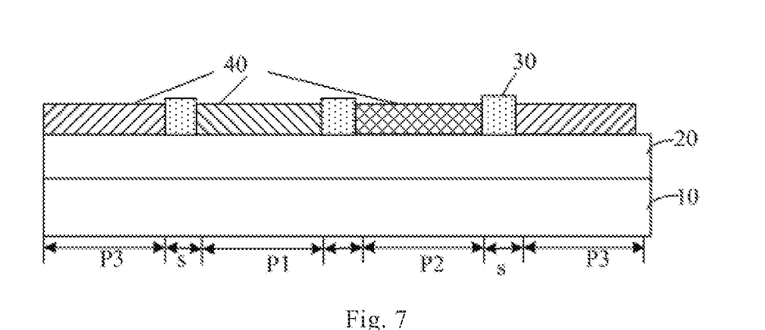
FIG. 7 is a schematic structural diagram of a quantum dot display substrate according to an embodiment of the present disclosure.

An embodiment of the present disclosure further provides a quantum dot display substrate, which is manufactured by the method described above. FIG. 7 is a schematic structural diagram of a quantum dot display substrate provided in an embodiment of the present disclosure, and as shown in FIG. 7, the quantum dot display substrate is divided into a plurality of pixel regions (P1, P2, and P3) and a spacer region S located between adjacent ones of the pixel regions, and the pixel regions are configured to emit light of at least one color. In some implementations, colors of the pixel region P1, the pixel region P2 and the pixel region P3 are red, green and blue, respectively.

The quantum dot display substrate includes: a substrate 10, and a carrier transport layer 20 disposed on the substrate 10. The carrier transport layer 20 is provided with: quantum dot layers 40 individually located in the pixel regions and a pattern-defining layer 30 located in the spacer region S; the quantum dot layer 40 in each pixel region is configured to emit light of a corresponding color. Hydrophilicity and hydrophobicity of a portion of the carrier transport layer 20 located in the pixel region are respectively the same as those of the quantum dot layer 40, and are opposite to those of the pattern-defining layer 30.

As described above, when the quantum dot layer is formed in each of the pixel regions, a pattern-defining material layer having a thickness ranging from 10 nm to 2 μm is formed, and the pattern-defining material layer in the pixel region where the quantum dot layer is to be formed is removed, so that the quantum dot display substrate manufactured by the above method has a pattern-defining layer 30 located in the spacer region S, which has a thickness ranging from 30 nm to 6 μm. In addition, a thickness of the quantum dot layer 40 in the present disclosure may range from 5 nm to 50 nm.

In some implementations, the carrier transport layer 20 is a hydrophilic electron transport layer, and the carrier transport layer 20 includes a plurality of nanostructures arranged in an array and oriented uniformly, so as to increase a specific surface area of the carrier transport layer 20 and improve an adhesion force of the quantum dot layer 40 on the carrier transport layer.

A material of the nanostructures may specifically include at least one of zinc oxide, magnesium zinc oxide, or titanium oxide.

In some implementations, the pattern-defining layer 30 is made of a photodegradable material, in such case, during a manufacturing process, the pattern-defining layer 30 may be formed by means of illumination, and an oxygen vacancy content in the nanostructures can be increased by continuous illumination, so as to achieve a relative high hydrophilicity of the electron transport layer.

A material of the pattern-defining layer 30 includes a polymer obtained by curing the hydrophobic solution described above.

An embodiment of the present disclosure further provides a display device, including the quantum dot display substrate.

The display device may be any product or component with a display function, such as an electronic paper, a display panel, a mobile phone, a tablet computer, a television, a display, a notebook computer, a digital photo frame, a navigator and the like.

In the above description of the quantum dot display substrate, the method for manufacturing the quantum dot display substrate, and the display device provided in the present disclosure, it can be seen that the present disclosure realizes patterning of quantum dots through a difference in adhesion force between the quantum dot solution and the carrier transport layer and between the quantum dot solution and the pattern-defining layer. The method of the present disclosure may be used for manufacturing a high resolution product.

It should be understood that the above embodiments are merely exemplary embodiments employed to illustrate the principles of the present disclosure, and the present disclosure is not limited thereto. It will be apparent to those skilled in the art that various changes and modifications may be made therein without departing from the spirit and scope of the present disclosure, and these changes and modifications are to be considered within the scope of the present disclosure.

The invention claimed is:

1. A method for manufacturing a quantum dot display substrate, wherein the quantum dot display substrate comprises a plurality of pixel regions which are arranged at intervals, and the pixel regions are configured to emit light of at least one color, the method comprises:
    forming a carrier transport layer on a substrate;
    forming a quantum dot layer emitting light of a corresponding color in each of the pixel regions, wherein forming the quantum dot layer in each of the pixel regions comprises:
    forming a pattern-defining layer on the carrier transport layer, wherein the pattern-defining layer exposes a portion of the carrier transport layer in the pixel region where the quantum dot layer is to be formed, covers remaining portion of the carrier transport layer, and has hydrophilicity and hydrophobicity opposite to those of the exposed portion of the carrier transport layer respectively;
    coating a quantum dot solution having the same hydrophilicity and hydrophobicity as those of the exposed portion of the carrier transport layer so that the quantum dot solution is attached to a surface of the exposed portion of the carrier transport layer; and curing the quantum dot solution to form the quantum dot layer.

2. The method of claim 1, wherein the carrier transport layer comprises a plurality of nanostructures arranged in an array and oriented uniformly.

3. The method of claim 2, wherein the nanostructures are nanorods.

4. The method of claim 2, wherein the carrier transport layer is a hydrophilic electron transport layer, and a material of the nanostructures comprises at least one of zinc oxide, magnesium zinc oxide, or titanium oxide;

the method further comprises:
before coating the quantum dot solution, illuminating the portion of the carrier transport layer in the pixel region where the quantum dot layer is to be formed, so as to improve an oxygen vacancy content of the nanostructures.

5. The method of claim 1, wherein the pattern-defining layer is made of a photodegradable material;

forming the pattern-defining layer on the carrier transport layer comprises:
forming a pattern-defining material layer;
exposing and degrading a portion of the pattern-defining material layer in the pixel region where the quantum dot layer is to be formed to obtain the pattern-defining layer.

6. The method of claim 5, wherein forming the pattern-defining material layer comprises:

placing and soaking the substrate formed with the carrier transport layer in a photodegradable hydrophobic system solution for a predetermined period of time, and removing the hydrophobic system solution outside a region where the carrier transport layer is located;
curing the hydrophobic system solution on the carrier transport layer to obtain the pattern-defining material layer.

7. The method of claim 6, wherein the hydrophobic system solution comprises a polymer resin, a hydrophobic solvent, a hydrophobic agent, and a photosensitizer.

8. The method of claim 7, wherein the hydrophobic solvent comprises a fluoroacrylate emulsion.

9. The method of claim 8, wherein the polymer resin comprises a polyketone resin or a polylactate resin; the fluoroacrylate emulsion comprises hexafluorobutyl methacrylate; the hydrophobic agent comprises perfluorooctylvinyldimethoxysilane; the photosensitizer comprises n-isobutyl benzoin.

10. The method of claim 1, wherein the quantum dot solution comprises a hydrophilic ligand.

11. A quantum dot display substrate, which is divided into a plurality of pixel regions and a spacer region located between adjacent ones of the pixel regions, the pixel regions are configured to emit light of at least one color, and the quantum dot display substrate comprises a substrate and a carrier transport layer arranged on the substrate;

a quantum dot layer in each of the pixel regions and a pattern-defining layer in the spacer region are arranged on the carrier transport layer, and the quantum dot layer in each of the pixel regions is configured to emit light of a corresponding color;
hydrophilicity and hydrophobicity of the portion of the carrier transport layer in the pixel region are respectively the same as those of the quantum dot layer, and are opposite to those of the pattern-defining layer.

12. The quantum dot display substrate of claim 11, wherein the pattern-defining layer is made of a photodegradable material.

13. The quantum dot display substrate of claim 11, wherein the carrier transport layer comprises a plurality of nanostructures arranged in an array and uniformly oriented.

14. The quantum dot display substrate of claim 13, wherein the carrier transport layer is an electron transport layer, and a material of the nanostructures comprises at least one of zinc oxide, magnesium zinc oxide, or titanium oxide.

15. A display device, comprising the quantum dot display substrate of claim 11.

* * * * *